United States Patent
Saji et al.

(10) Patent No.: US 9,282,632 B2
(45) Date of Patent: Mar. 8, 2016

(54) MULTILAYER CIRCUIT SUBSTRATE

(71) Applicant: TAIYO YUDEN CO., LTD., Tokyo (JP)

(72) Inventors: Tetsuo Saji, Tokyo (JP); Hiroshi Nakamura, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 86 days.

(21) Appl. No.: 13/861,907

(22) Filed: Apr. 12, 2013

(65) Prior Publication Data

US 2014/0133114 A1      May 15, 2014

(30) Foreign Application Priority Data

Nov. 14, 2012   (JP) .................... 2012-250241

(51) Int. Cl.
| H05K 1/18 | (2006.01) |
| H05K 1/02 | (2006.01) |
| H01P 3/08 | (2006.01) |
| H05K 3/46 | (2006.01) |

(52) U.S. Cl.
CPC .............. *H05K 1/0253* (2013.01); *H01P 3/088* (2013.01); *H05K 1/0227* (2013.01); *H05K 1/185* (2013.01); *H05K 3/4602* (2013.01); *H05K 2201/09245* (2013.01); *H05K 2201/09336* (2013.01); *H05K 2201/09727* (2013.01)

(58) Field of Classification Search
CPC ................................................... H05K 1/0237
USPC .......... 361/760, 761, 777, 778; 174/255, 260, 174/262, 265; 257/737, 490, 690, 706
See application file for complete search history.

(56) References Cited

U.S. PATENT DOCUMENTS

| 4,869,671 | A | * | 9/1989 | Pressley et al. ................. 439/55 |
| 5,432,485 | A | | 7/1995 | Nagashima |
| 5,907,265 | A | * | 5/1999 | Sakuragawa et al. ............ 333/1 |
| 6,057,512 | A | * | 5/2000 | Noda et al. .................... 174/250 |
| 6,522,214 | B1 | * | 2/2003 | Harju et al. ....................... 333/1 |
| 7,098,531 | B2 | * | 8/2006 | Saito et al. .................... 257/692 |

(Continued)

FOREIGN PATENT DOCUMENTS

| JP | H7-38301 A | 2/1995 |
| JP | H10-188685 A | 7/1998 |

(Continued)

OTHER PUBLICATIONS

Japanese Office Action dated Apr. 24, 2013, in a Japanese patent application No. 2013-023448.

*Primary Examiner* — Yuriy Semenenko (74) *Attorney, Agent, or Firm* — Chen Yoshimura LLP (57) ABSTRACT

A multilayer circuit substrate includes: a first conductor layer in which first transmission lines and a second transmission line are formed; a second conductive layer facing the first conductive layer through an insulating layer; and a third conductive layer that faces the second conductive layer through an insulating layer and that has a bypass line formed therein. The bypass line is electrically connected to the second transmission line of the first conductive layer through via conductors and such that the second transmission line and the first transmission lines intersect with each other. In the second conductive layer, a ground conductor is formed at least in a position that faces the bypass line, and the first transmission lines are made narrower at the intersection with the second transmission line than other portions.

10 Claims, 5 Drawing Sheets

(56) References Cited

U.S. PATENT DOCUMENTS

| | | | |
|---|---|---|---|
| 7,751,202 B2 * | 7/2010 | Seo et al. | 361/795 |
| 2003/0045083 A1 * | 3/2003 | Towle et al. | 438/612 |
| 2004/0084212 A1 * | 5/2004 | Miller | 174/261 |

FOREIGN PATENT DOCUMENTS

| | | |
|---|---|---|
| JP | 3263919 B2 | 3/2002 |
| JP | 2002-368507 A | 12/2002 |

* cited by examiner

Isolation Simulation Model

MULTILAYER CIRCUIT SUBSTRATE

This application claims the benefit of Japanese Application No. 2012-250241, filed in Japan on Nov. 14, 2012, which is hereby incorporated by reference in its entirety.

BACKGROUND OF THE INVENTION

1. Field of the Invention

The present invention relates to a multilayer circuit substrate formed by alternately stacking conductive layers and insulating layers, and more particularly, to a structure of a circuit pattern suitable for a high frequency circuit.

2. Description of Related Art

Conventionally, the technique disclosed in Patent Document 1, for example, has been known as a technique for forming transmission lines so as to intersect with each other in a multilayer circuit substrate. In the technique disclosed in Patent Document 1, transmission lines are formed to intersect with each other by disposing one transmission line in a conductive layer in the circuit substrate and by disposing the other transmission line in another conductive layer. Also, the configuration disclosed in Patent Document 1 is made for transmitting high-frequency signals, and therefore, a conductive layer having a large enough ground conductor is interposed between the transmission lines. This way, the transmission lines function as micro-strip lines, thereby having prescribed characteristic impedance. Also, by the ground conductor, interference between the transmission lines such as cross-talk is prevented, in other words, isolation between the transmission lines is ensured.

RELATED ART DOCUMENT

Patent Document

Patent Document 1: Japanese Patent Application Laid-Open Publication No. 2002-368507

SUMMARY OF THE INVENTION

However, with the configuration disclosed in Patent Document 1, it was difficult to sufficiently respond to recent demands for thickness reduction and density improvement of a multilayer circuit substrate. That is, in order to reduce the thickness of a multilayer circuit substrate, it is necessary to reduce the thickness of insulating layers, but if the thickness of the insulating layers is merely reduced in the configuration disclosed in Patent Document 1, the characteristic impedance of the transmission lines is changed, resulting in a problem. This is because one of the parameters to determine the characteristic impedance is a capacitance value between the ground conductor and the transmission line, and the capacitance value is determined by using a distance between the ground conductor and the transmission line as one of the parameters. Therefore, when the insulating layer is made thinner, the capacitance value increases, causing the characteristic impedance to be reduced. One of the solutions to this issue is to reduce the number of layers in the multilayer circuit substrate, thereby ensuring a sufficient thickness of the insulating layers, but with this method, the total area where circuit patterns can be formed is made smaller, which makes it difficult to achieve higher density. Another possible solution is to adjust the characteristic impedance by making the transmission lines narrower, but when the line width is made smaller, direct-current resistance components increase, causing a larger transmission loss. As a result, it was necessary to form micro-strip lines by disposing transmission lines and ground patterns so as to face each other through a plurality of thin insulating layers. Further, at the intersection of one transmission line and the other transmission line, it is necessary to provide a ground conductive layer between the two lines so as to prevent interference. This further increased the number of layers, hindering the thickness reduction. The increase in number of layers also caused problems such as higher substrate price.

The present invention was made in view of the above situations, and an object thereof is to provide a multilayer circuit substrate that can achieve thickness reduction and density improvement with ease and that is suitable for a high frequency circuit.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present invention provides a multilayer circuit substrate formed by alternately stacking insulating layers and conductive layers, including a first conductive layer having a first transmission line and a second transmission line formed therein; a second conductive layer facing the first conductive layer through an insulating layer; and a third conductive layer facing the second conductive layer through an insulating layer, the third conductive layer having a bypass line electrically connected to the second transmission line of the first conductive layer through a via conductor so as to allow the second transmission line to intersect with the first transmission line, wherein the second conductive layer has a ground conductor formed at least in a position that faces the bypass line, and wherein the first transmission line is formed such that a line width thereof at an intersection with the second transmission line is made smaller than that in other portions.

According to the present invention, in the second conductive layer that is interposed between the first conductive layer in which the first transmission line and the second transmission line are formed and the third conductive layer in which the bypass line for the second transmission line is formed, a ground conductor is formed so as to face the bypass line. This makes it possible to allow the first transmission line and the second transmission line to intersect with each other while ensuring isolation between the first transmission line and the second transmission line, and while minimizing a loss in transmission signals due to direct-current resistance components. On the other hand, at the intersection, the width of the first transmission line is made smaller than other portions, and therefore, the characteristic impedance can be made uniform in the entire transmission line. In the present invention, conductive layers include not only the layers formed inside of the multilayer circuit substrate, but also layers formed on the surfaces thereof.

In a preferred embodiment of the present invention, the multilayer circuit substrate includes a fourth conductive layer that faces the third conductive layer through an insulating layer and that has a ground conductor formed at least in a position that faces the bypass line. With this configuration, at the bypass line for the second transmission line, the characteristic impedance can be ensured with ease, and isolation from a wiring pattern of a main substrate after mounting can also be ensured with ease.

In a preferred embodiment of the present invention, the ground conductor in the second conductive layer has an opening pattern at least in a position that faces the first transmission line other than the intersection with the second transmission line, and the third conductive layer has a ground conductor formed in a position that faces the first transmission line of the first conductive layer. With this configuration, it is possible to obtain uniform characteristic impedance throughout the transmission line with ease and reliably.

In a preferred embodiment of the present invention, in the first conductive layer, a plurality of first transmission lines are formed so as to be parallel to each other, and between the plurality of first transmission lines, first ground lines are formed so as to be parallel to the first transmission lines. The ground conductor of the second conductive layer includes second ground lines formed so as to face the first ground lines in the opening pattern. With this configuration, isolation between the respective plurality of first transmission lines can be improved. Also, in this case, by making the width of the second ground lines greater than that of the first ground lines, isolation between the respective plurality of first transmission lines can further be improved.

In a preferred embodiment of the present invention, a core layer that is thicker than any of the first to third conductive layers is provided. In the core layer, a recess or a penetration hole is formed, and in the recess or the penetration hole, an electronic component is embedded. In a preferred embodiment of the present invention, an electronic component is mounted on the multilayer circuit substrate according to any one of claims 1 to 5.

As described above, with the multilayer circuit substrate of the present invention, it is possible to obtain uniform characteristic impedance throughout the transmission lines while ensuring isolation between the respective plurality of transmission lines. As a result, the multilayer circuit substrate that can achieve thickness reduction and density improvement with ease and that is suitable for a high frequency circuit can be provided.

DETAILED DESCRIPTION OF THE PREFERRED EMBODIMENTS

Embodiment 1

Figure 1:
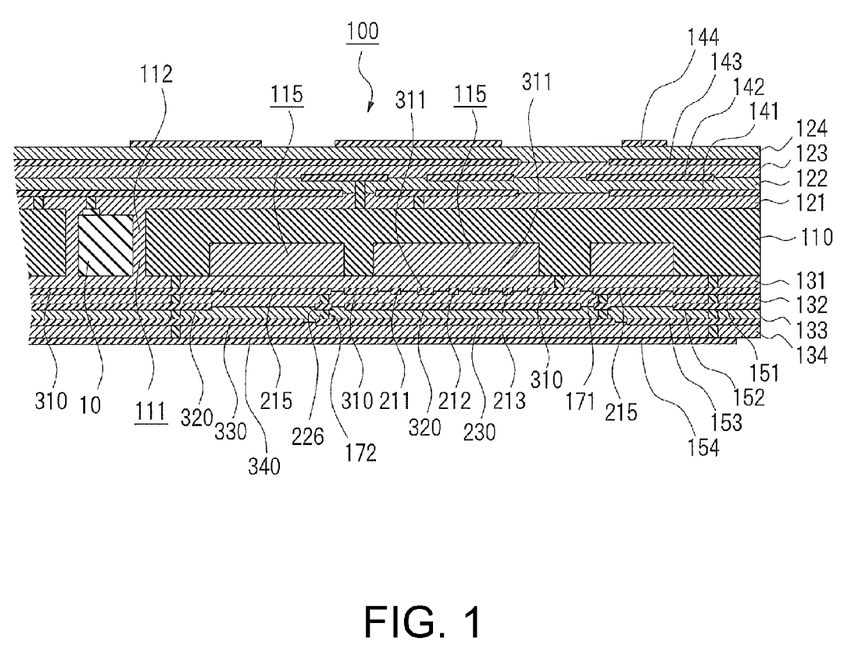
FIG. 1 is a cross-sectional view of a part of a multilayer circuit substrate.

A multilayer circuit substrate according to Embodiment 1 of the present invention will be explained with reference to figures. In the present embodiment, a multilayer circuit substrate that is used for a high frequency circuit module and that has electronic components embedded therein will be explained. FIG. 1 is a cross-sectional view of a part of a multilayer circuit substrate. In the present embodiment, for ease of explanation, configurations relating to the gist of the present invention will mainly be explained.

The multilayer circuit substrate 100 is a multilayer substrate formed by alternately stacking insulating layers and conductive layers. As shown in FIG. 1, the multilayer circuit substrate 100 includes a core layer 110 as a conductive layer that has excellent conductive properties and that is made of a metal to be relatively thick; a plurality (four each in the present embodiment) of insulating layers 121 to 124 and conductive layers 141 to 144 formed on one main surface (upper surface) of the core layer 110; and a plurality (four each in the present embodiment) of insulating layer 131 to 134 and conductive layers 151 to 154 formed on the other main surface (lower surface) of the core layer 110. The insulating layers 121 to 124 and 131 to 134 and the conductive layers 141 to 144 and 151 to 154 are formed on the respective main surfaces of the core layer 110 by the build-up method. The respective insulating layers 121 to 124 and 131 to 134 are formed in the same thickness. The respective conductive layers 141 to 144 and 151 to 154 are formed in the same thickness. The conductive layers 144 and 154 correspond to respective surface layers of the multilayer circuit substrate 100. The conductive layer 144 corresponds to a part mounting surface of the high frequency circuit module, and a circuit pattern for transmitting high frequency signals, lands for mounting external components, inspection pads, and the like are formed therein. The conductive layer 154 corresponds to the bottom surface through which the high frequency circuit module is mounted on a main circuit substrate, and terminal electrodes, ground electrodes, and the like are formed therein.

The core layer 110 has penetrating holes 111 to store electronic components therein. In the penetrating holes 111, electronic components 10 such as elastic wave filters used for a high frequency circuit, for example, are disposed. Therefore, it is preferable that the thickness of the core layer 110 be greater than the height of the electronic components stored therein and that the core layer 110 have a great bending strength. The core layer 110 is made of an electrically conductive material, and is provided with a reference potential (ground). Therefore, broadly, the core layer 110 can be regarded as a conductive layer of the multilayer circuit substrate 100. In the present embodiment, the core layer 110 is made of a metal plate, more specifically, a metal plate made of a copper or copper alloy. Spaces around the stored components in the penetrating holes 111 are filled with an insulating member 112 such as a resin.

Figure 2:
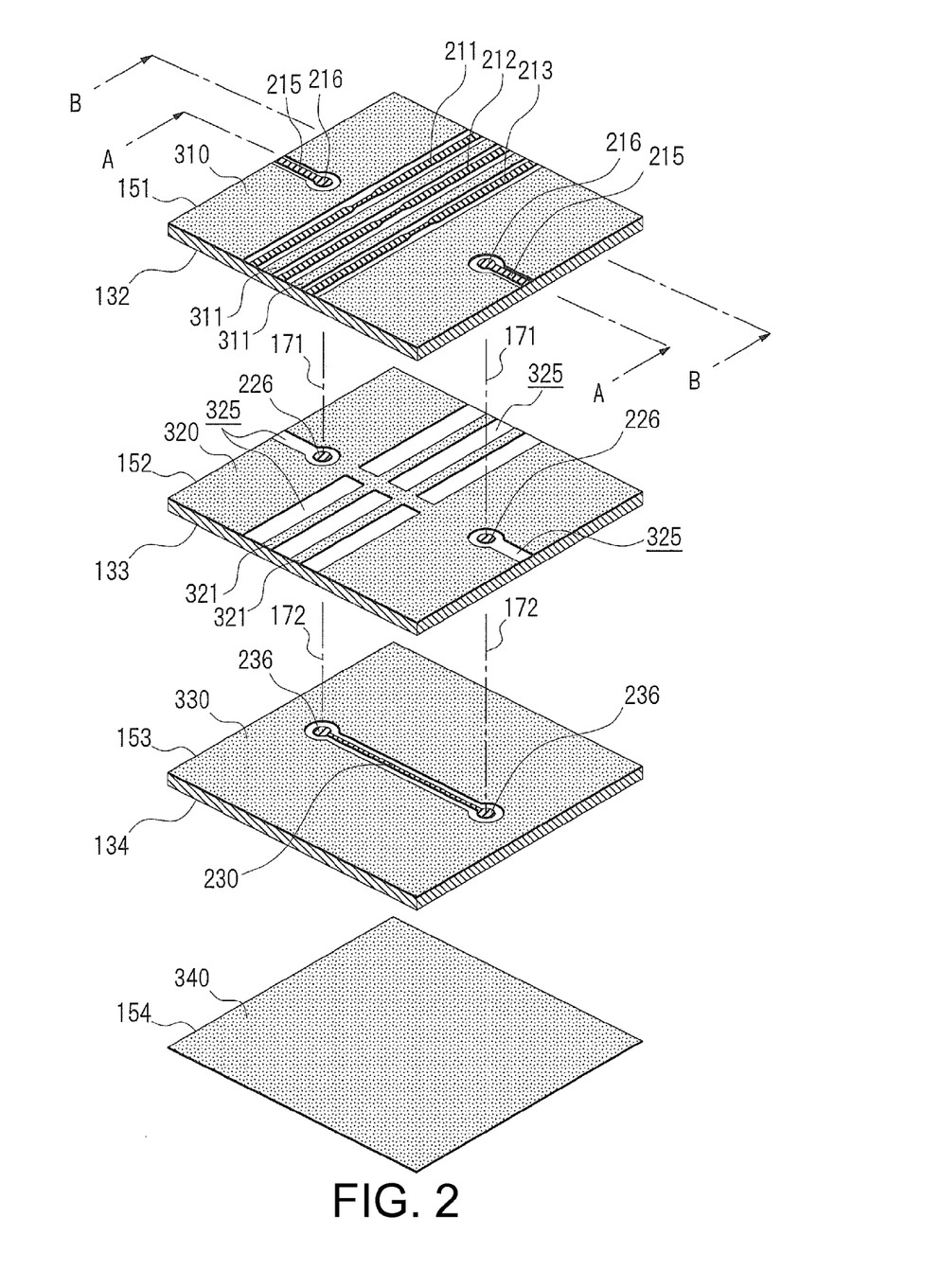
FIG. 2 is an exploded perspective view illustrating a main part of a multilayer circuit substrate.
Figure 3:
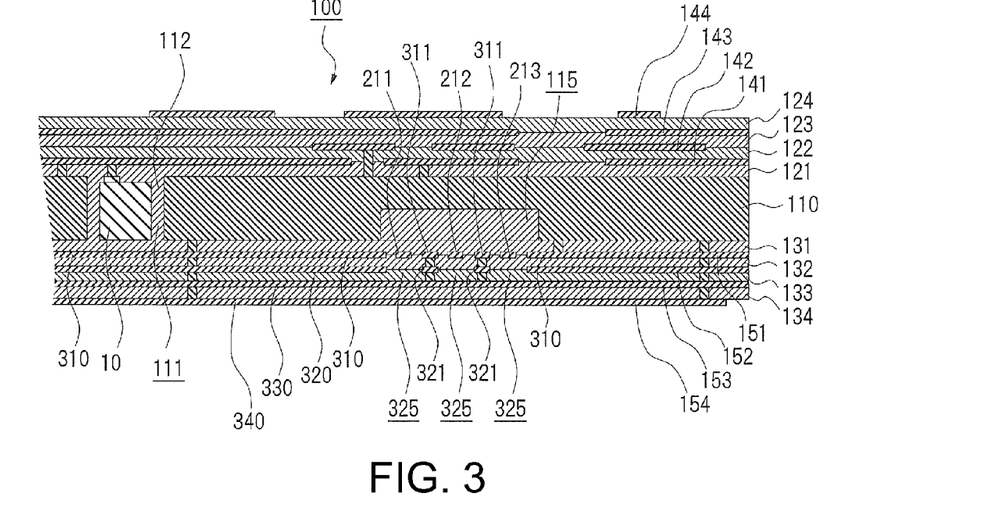
FIG. 3 is a cross-sectional view of a part of a multilayer circuit substrate.

Features of the present invention relate to a method for forming a circuit pattern in the multilayer circuit substrate 100, and more particularly, to a structure in which transmission lines for transmitting high frequency signals intersect with each other. The features of the present invention will be explained with reference to FIGS. 1 to 3. FIG. 2 is an exploded perspective view illustrating a main part of the multilayer circuit substrate. FIG. 2 is an exploded perspective view showing part of the insulating layers 132 to 134 and the conductive layers 151 to 154 of FIG. 1. FIG. 3 is a cross-sectional view along the arrow B of FIG. 2. FIG. 1 described above is a cross-sectional view along the arrow A of FIG. 2.

In the first conductive layer 151, first transmission lines 211, 212, and 213 that transmit high frequency signals are formed so as to be parallel to each other. The first conductive layer 151 also has a second transmission line 215 formed therein for transmitting high frequency signals. In the present embodiment, in order to have the first transmission lines 211 to 213 and the second transmission line 215 intersect with each other, a bypass line 230 for the second transmission line 215 is formed in the third conductive layer 153. At the ends of the second transmission line 215, lands 216 are formed so as to connect the second transmission line 215 to the bypass line 230. The first transmission lines 211 to 213 are formed to have the same line width as the second transmission line 215. However, at the intersection with the second transmission line 215, that is, in a region overlapping with a projection region of the bypass line 230 in the thickness direction, the first transmission lines 211 to 213 are formed to be narrower than other portions. It is preferable that the line width of the first transmission lines 211 to 213 gradually change, that is, it is preferable that the outer edges of the first transmission lines 211 to 213 are tapered with respect to the intersection with the second transmission line 215. In the entire first conductive layer 151, a ground conductor 310 is formed, except for areas where the first transmission lines 211 to 213, the second transmission line 215, other necessary circuit patterns (not shown), and the like are provided. The ground conductor 310 is formed at a prescribed distance from the first transmission lines 211 to 213 and the second transmission line 215. The ground conductor 310 includes inter-transmission line ground conductors 311 formed between the respective transmission lines 211 to 213 so as to be parallel thereto.

In the second conductive layer 152, a ground conductor 320 is formed at least in a position where the projection region thereof overlaps with the intersection of the first transmission lines 211 and 213 and the second transmission line 215, in other words, in a position overlapping with the projection region of the bypass line 230 (position facing the bypass line 230), further in other word, between the first transmission lines 211 to 213 and the bypass line 230. In the present embodiment, the ground conductor 320 is formed in the entire second conductive layer 152, except for areas where necessary circuit patterns, lands (not shown), and the like are formed. However, the ground conductor 320 has an opening pattern 325, in which a conductor is not formed, in positions that face the first transmission lines 211 to 213 and the second transmission line 215 of the first conductive layer 151. The ground conductor 320 includes ground conductors 321 formed so as to face the inter-transmission line ground conductors 311 of the first conductive layer 151. The width of the opening pattern 325 is larger than that of the corresponding transmission lines. The width of the ground conductors 321 is the same as the width of the inter-transmission line ground conductors 311. On the other hand, as described above, in the position where the projection region thereof overlaps with the intersection of the first transmission lines 211 and 213 and the second transmission line 215, in other words, in the position overlapping with the projection region of the bypass line 230 (position facing the bypass line 230), and further in other words, between the first transmission lines 211 to 213 and the bypass line 230, the ground conductor 320 is formed, instead of the opening pattern 325. The second conductive layer 152 has the lands 226 formed in positions that face the lands 216 of the first conductive layer 151. The lands 226 are connected to the lands 216 of the first conductive layer 151 through via conductors 171. The ground conductors 321 are connected to the inter-transmission line ground conductors 311, and to a ground conductor 330 of the third conductive layer 153, which will be later described, through via conductors (not shown in FIG. 2). It is preferable to provide via conductors connected to the ground conductors 321 at a plurality of locations, from a perspective of stabilizing the ground potential and improving isolation between the respective transmission lines.

As described above, the third conductive layer 153 has the bypass line 230 for the second transmission line 215, facing the first transmission lines 211 to 213. The width of the bypass line 230 is smaller than the width of the second transmission line 215, and is the same as the line width of the first transmission lines 211 to 213 at the intersection. At both ends of the bypass line 230, lands 236 are formed. The lands 236 are connected to the lands 226 of the second conductive layer 152 through via conductors 172. The ground conductor 330 is formed in the entire third conductive layer 153, except for areas where the bypass line 230, the lands 236, other necessary circuit patterns (not shown), and the like are provided.

In the fourth conductive layer 154, a ground conductor 340 is formed at least in a position that faces the bypass line 230. The ground conductor 340 functions as a ground electrode of the high frequency circuit module. In the present embodiment, the ground conductor 340 is formed in the entire fourth conductive layer 154, except for areas where necessary terminal electrodes (not shown) and the like are provided.

The core layer 110 has a groove 115 formed therein so as to face the first transmission lines 211 to 213 and the second transmission line 215 formed in the first conductive layer 151. The depth of the groove 115 is greater than the thickness of the insulating layer 131, such that the effect of the core layer 110 on the characteristic impedance of the first transmission lines 211 to 213 and the second transmission line 215 is made sufficiently small.

In the above-mentioned multilayer circuit substrate 100, the ground conductor 320 is interposed between the first transmission lines 211, 212, and 213 and the bypass line 230. This makes it possible to allow the first transmission lines 211, 212, and 213 and the second transmission line 215 to intersect with each other while ensuring isolation between the first transmission lines 211, 212, and 213 and the second transmission line 215.

Because the opening pattern 325 is formed in the ground conductor 320 of the second conductive layer 152 in portions other than the intersection with the second transmission line 215, the characteristic impedance of the first transmission lines 211 to 213 is determined by using distances to the ground conductor 310 of the first conductive layer 151 and to the ground conductor 330 of the third conductive layer 153 as one of the parameters. On the other hand, in the second conductive layer 152, the ground conductor 320 is formed at the intersection with the second transmission line 215, and the distances to the ground conductor 310 of the first conductive layer 151 and to the ground conductor 320 of the second conductive layer 152 are used as one of the parameters to determine the characteristic impedance. It is apparent that the distance between the first conductive layer 151 and the second conductive layer 152 is shorter than the distance between the first conductive layer 151 and the third conductive layer 153. At the intersection with the second transmission line 215, the line width of the first transmission lines 211 to 213 is made narrower than other portions. This makes it possible to make the characteristic impedance of the first transmission lines 211 to 213 at the intersection coincide with that of the areas other than the intersection, and the increase in direct-current resistance components can be kept minimum. The core layer 110 that functions as a ground faces the first transmission lines 211 to 213 through the insulating layer 131, but the core layer 110 has the groove 115 formed at a position that faces the first transmission lines 211 to 213. This makes it possible to make the distance between the first transmission lines 211 to 213 and the core layer 110 sufficiently large, and as a result, the effect of the core layer 110 on the characteristic impedance of the first transmission lines 211 to 213 can be made sufficiently small. Further, because the respective transmission lines are surrounded by the core layer 110 and the ground conductors 310, 320, 330, and 340, the shielding effect can be improved.

The characteristic impedance of the second transmission line 215 is determined by using distances to the ground conductor 310 of the first conductive layer 151 and to the ground conductor 330 of the third conductive layer 153 as one of the parameters because the opening pattern 325 is formed in the ground conductor 320 of the second conductive layer 152. The characteristic impedance of the bypass line 230 for the second transmission line 215 is determined by using the distances to the ground conductor 320 of the second conductive layer 152, to the ground conductor 330 of the third conductive layer 153, and to the ground conductor 340 of the fourth conductive layer 154 as one of the parameters. It is apparent that the distances from the third conductive layer 153 to the second conductive layer 152 and to the fourth conductive layer 154 are shorter than the distance between the first conductive layer 151 and the third conductive layer 153. On the other hand, the line width of the bypass line 230 is made narrower than the second transmission line 215 formed in the first conductive layer 151. This makes it possible to make the characteristic impedance of the bypass line 230 coincide with that of the second transmission line 215. The core layer 110 that functions as a ground faces the second transmission line 215 through the insulating layer 131, but the core layer 110 has the groove 115 formed at a position that faces the second transmission line 215. This makes it possible to make the distance between the second transmission line 215 and the core layer 110 sufficiently large, and as a result, the effect of the core layer 110 on the characteristic impedance of the second transmission line 215 can be made sufficiently small.

When the circuit module is constructed with the multilayer circuit substrate 100 of the present embodiment, because the ground conductor 340 is interposed between the wiring conductor of the main substrate on which the circuit module is mounted and the bypass line 230 of the multilayer circuit substrate 100, the interference between the respective wiring lines can be made smaller.

As described above, with the multilayer circuit substrate 100 of the present embodiment, it is possible to obtain uniform characteristic impedance throughout the transmission lines while ensuring isolation between the respective plurality of transmission lines. As a result, a multilayer circuit substrate that can achieve thickness reduction and density improvement with ease and that is suitable for a high frequency circuit can be provided.

Embodiment 2

Figure 4:
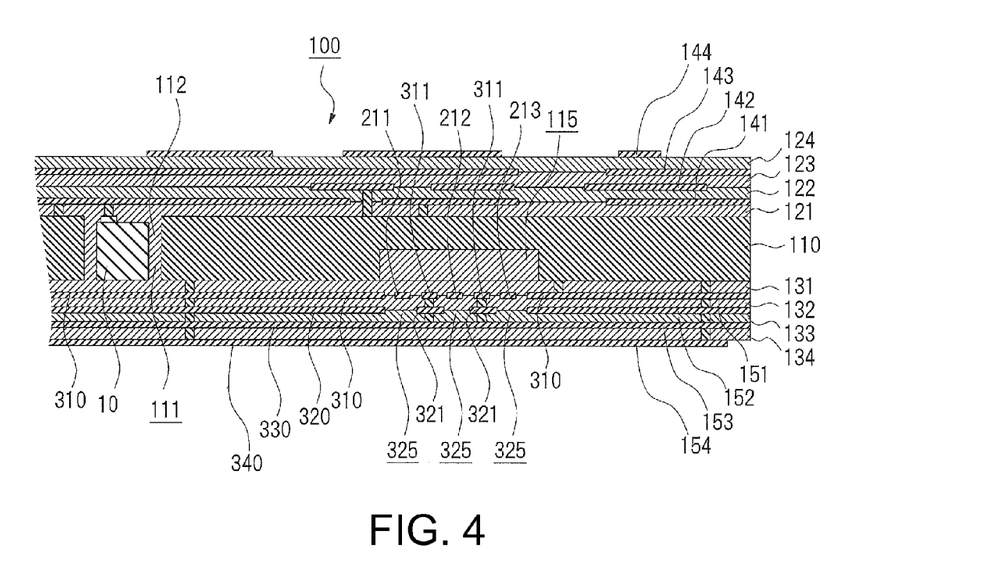
FIG. 4 is a cross-sectional view of a part of a multilayer circuit substrate.

A multilayer circuit substrate according to Embodiment 2 of the present invention will be explained with reference to figures. In the present embodiment, in a manner similar to Embodiment 1, a multilayer circuit substrate that is used for a high frequency circuit module and that has electronic components embedded therein will be explained. FIG. 4 is a cross-sectional view of a part of a multilayer circuit substrate. In the present embodiment, for ease of explanation, configurations relating to the gist of the present invention will mainly be explained.

As shown in FIG. 4, the multilayer circuit substrate 100 of the present embodiment differs from that of Embodiment 1 in that the width of the ground conductors 321 of the second conductive layer 152, which face the inter-transmission line ground conductors 311 of the first conductive layer 151, is greater than the width of the inter-transmission line ground conductors 311. This makes it possible to improve the shielding characteristics between the respective first transmission lines 211, 212, and 213, thus improving isolation therebetween as compared with Embodiment 1. Other configurations, features, and effects are the same as those of Embodiment 1.

Figure 5:
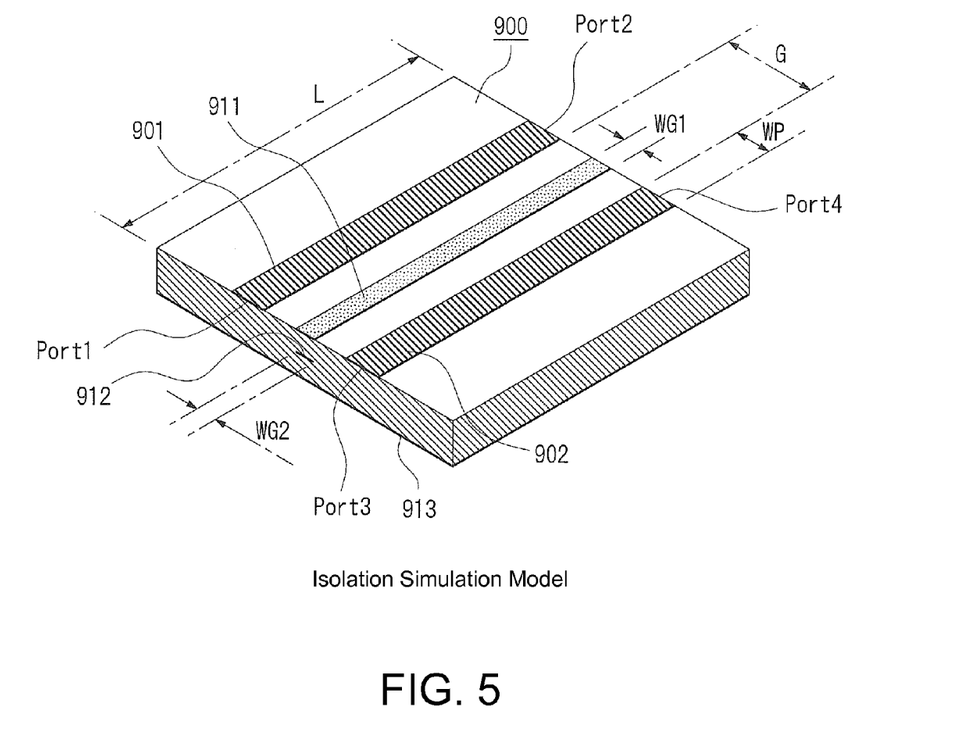
FIG. 5 is a diagram showing an isolation simulation model.

A simulation was conducted to verify that isolation between the respective first transmission lines 211, 212, and 213 in the multilayer circuit substrate 100 of the present embodiment is improved from that of Embodiment 1. FIG. 5 is a diagram showing a simulation model. As shown in FIG. 5, transmission lines 901 and 902 were formed so as to be parallel to each other on one main surface (upper surface) of a multilayer circuit substrate 900, and a first ground conductor 911 was formed between the transmission lines 901 and 902. Inside of the multilayer circuit substrate 900, a second ground conductor 912 was formed so as to face the first ground conductor 911. On the other main surface (bottom surface) of the multilayer circuit substrate 900, a third ground conductor 913 was formed to cover the entire surface. The respective ground conductors 911, 912, and 913 are connected to the ground (reference potential).

In this model, one end of the transmission line 901 is a port 1, the other end of the transmission line 901 is a port 2, one end of the transmission line 902 on the same side as the port 1 is a port 3, and the other end of the transmission line 902 is a port 4. A sine wave from 1 GHz to 6 GHz is applied between the port 1 and the port 2, and a prescribed load (impedance element) is connected to the port 3 and the port 4. In this state, S31 parameter, which is one of S parameters, is obtained through simulation. The S31 parameter represents isolation between the transmission lines 901 and 902, and the smaller the value is, the better the isolation is.

Figure 6:
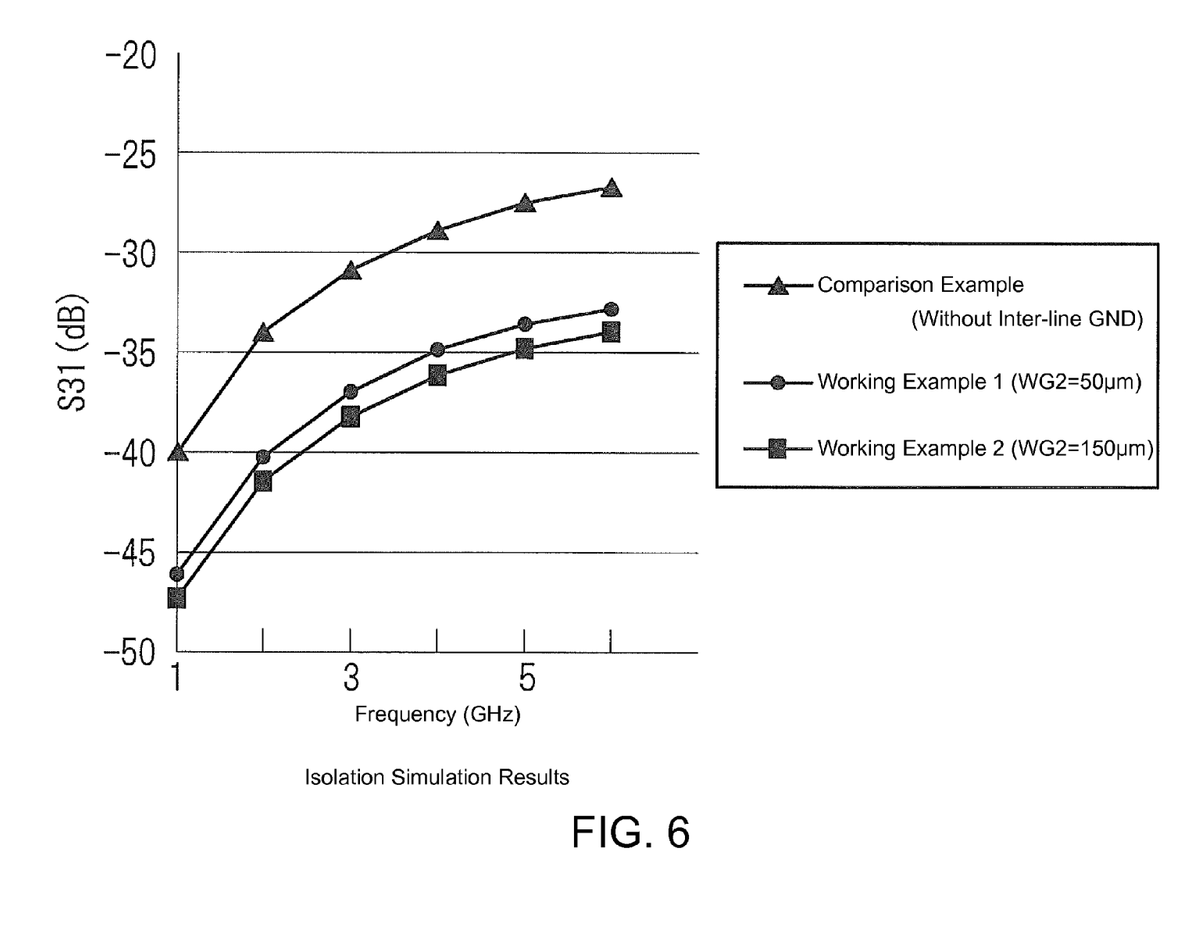
FIG. 6 shows the isolation simulation results.

In Working Example 1 (corresponding to Embodiment 1), the line width WG1 of the first ground conductor 911 was set to 50 µm, the line width WG2 of the second ground conductor 912 was set to 50 µm, and the simulation was conducted to obtain S31. In Working Example 2 (corresponding to Embodiment 2), the line width WG1 of the first ground conductor 911 was set to 50 µm, the line width WG2 of the second ground conductor 912 was set to 150 µm, and the simulation was conducted to obtain S31. Also, a model in which the first ground conductor 911 or the second ground conductor 912 is not formed was prepared as a comparison example, and the simulation was conducted to obtain S31 thereof. The common parameters in the respective examples were set as follows: the line width WP of the transmission lines 901 and 902 was 115 µm, the spacing G between the transmission lines 901 and 902 was 200 µm, the thickness of the respective conductors was 10 µm, the distance between the transmission lines 901 and 902 and the third ground conductor 913 was 60 µm, and the line length L of the transmission lines 901 and 902 was 6 mm. FIG. 6 shows the simulation results. As apparent from FIG. 6, isolation in Working Examples 1 and 2, in which the first ground conductor 911 and the second ground conductor 912 are provided, was better than that of the comparison example not provided with the conductors over the entire frequency band. The isolation in Working Example 2 in which the second ground conductor 912 is made wider is better than that of Working Example 1 over the entire frequency band.

Embodiments of the present invention were described above, but the present invention is not limited thereto. For example, in the respective embodiments above, the first transmission lines 211, 212, and 213 and the second transmission line 215 were formed inside of the multilayer circuit substrate 100, but these lines may be formed on the surface layer.

In the respective embodiments above, the respective insulating layers 121 to 124 and 131 to 134 were formed in the same thickness, and the respective conductive layers 141 to 144 and 151 to 154 were formed in the same thickness. However, the thickness of each layer may be appropriately changed.

In the respective embodiments above, the ground conductor 310 of the first conductive layer 151 was formed in the entire surface, except for areas where the first transmission lines 211 to 213, the second transmission line 215, other necessary circuit patterns (not shown), and the like are formed. However, the ground conductor 310 does not have to be formed in the entire surface as long as it is formed outside of the first transmission lines 211 and 213 so as to face these lines and between the respective first transmission lines 211 to 213. The same is true for the ground conductors 320, 330, and 340.

In the respective embodiments above, the inter-transmission line ground conductors 311 were formed between the respective first transmission lines 211 to 213, but if necessary isolation can be ensured between the respective first transmission lines 211 to 213, the inter-transmission line ground conductors 311 do not necessarily have to be formed. For example, when signals flow through the transmission lines at different communication timing, or when the frequencies of the signals are separated from each other, thereby causing little effect, the inter-transmission line ground conductors 311 are not necessary. In these cases, the ground conductors 321 of the second conductive layer 152 formed so as to face the inter-transmission line ground conductors 311 are not necessary either. Similarly, in the respective embodiments above, the ground conductors 321 are formed in the second conductive layer 152 so as to face the inter-transmission line ground conductors 311, but when necessary isolation can be ensured between the respective first transmission lines 211 to 213, the ground conductors 321 do not necessarily have to be formed.

In the respective embodiments above, an example of providing the core layer 110 was described, but the multilayer circuit substrate does not have to have the core layer 110. In this case as well, the first transmission lines 211, 212, and 213 and the second transmission line 215 may be formed in any appropriate layer.

In the respective embodiments above, an example of forming the core layer 110 of copper or copper alloy was described, but there is no limitation on the material, and other metals, alloys, or resins can be used. The core layer 110 does not have to have electrical conductive properties. In the respective embodiments above, the penetrating holes 111 were formed in the core layer 110, and electronic components such as filters were disposed in the penetrating holes 111. However, the core layer 110 may have recesses formed therein, instead of the penetrating holes 111, and electronic components may be disposed in the recesses.

The multilayer circuit substrate 100 of the respective embodiments above is used as a high frequency circuit module after mounting electric components on lands and the like formed in the conductive layer 144 thereof. It is preferable to provide a case or to seal the multilayer circuit substrate 100 with a resin so as to cover all of or a part of the upper surface thereof.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A multilayer circuit substrate formed by alternately stacking insulating layers and conductive layers, comprising:
   a first conductive layer having a first transmission line and a second transmission line formed therein;
   a second conductive layer facing the first conductive layer through an insulating layer; and
   a third conductive layer facing the second conductive layer through an insulating layer, the third conductive layer having a bypass line electrically connected to the second transmission line of the first conductive layer through a via conductor so as to allow the second transmission line to intersect with the first transmission line,
   wherein the second conductive layer has a ground conductor formed at least in a position that overlaps the bypass line in a plan view, and
   wherein the first transmission line is formed such that a line width thereof at an intersection with the second transmission line is made smaller than that in other portions.

2. The multilayer circuit substrate according to claim 1, further comprising a fourth conductive layer facing the third conductive layer through an insulating layer, the fourth conductive layer having a ground conductor formed at least in a position that overlaps the bypass line in a plan view.

3. The multilayer circuit substrate according to claim 1, further comprising a core layer that is thicker than any of the first to third conductive layers,
   wherein the core layer has a recess or penetrating hole formed therein, and
   wherein an electronic component is embedded in the recess or penetrating hole.

4. A high frequency circuit module, comprising:
   the multilayer circuit substrate according to claim 1; and
   an electronic component mounted on the multilayer circuit substrate.

5. A multilayer circuit substrate formed by alternately stacking insulating layers and conductive layers, comprising:
   a first conductive layer having a first transmission line and a second transmission line formed therein;
   a second conductive layer facing the first conductive layer through an insulating layer; and
   a third conductive layer facing the second conductive layer through an insulating layer, the third conductive layer having a bypass line electrically connected to the second transmission line of the first conductive layer through a via conductor so as to allow the second transmission line to intersect with the first transmission line,
   wherein the second conductive layer has a ground conductor formed at least in a position that faces the bypass line,
   wherein the first transmission line is formed such that a line width thereof at an intersection with the second transmission line is made smaller than that in other portions,
   wherein, in the ground conductor of the second conductive layer, an opening pattern is formed at least in a position that faces the first transmission line, except for an intersection with the second transmission line, and
   wherein the third conductive layer has a ground conductor formed in a position that faces the first transmission line of the first conductive layer.

6. The multilayer circuit substrate according to claim 5, wherein, in the first conductive layer, a plurality of the first transmission lines are formed so as to be parallel to each other, and between the plurality of the first transmission lines, first ground lines are formed so as to be parallel to the first transmission lines, and wherein the ground conductor of the second conductive layer includes second ground lines formed so as to face the first ground lines in the opening pattern.

7. The multilayer circuit substrate according to claim 6, wherein the second ground lines are made wider than the first ground lines.

8. The multilayer circuit substrate according to claim 5, further comprising a fourth conductive layer facing the third conductive layer through an insulating layer, the fourth conductive layer having a ground conductor formed at least in a position that faces the bypass line.

9. The multilayer circuit substrate according to claim 5, further comprising a core layer that is thicker than any of the first to third conductive layers, wherein the core layer has a recess or penetrating hole formed therein, and wherein an electronic component is embedded in the recess or penetrating hole.

10. A high frequency circuit module, comprising:

the multilayer circuit substrate according to claim 5; and an electronic component mounted on the multilayer circuit substrate.

* * * * *